(12) United States Patent
Zhou et al.

(10) Patent No.: US 10,345,398 B1
(45) Date of Patent: Jul. 9, 2019

(54) SYSTEMS AND METHODS FOR VECTOR HYSTERESIS ANALYSIS

(71) Applicant: Ansys, Inc., Canonsburg, PA (US)

(72) Inventors: Ping Zhou, Bethel Park, PA (US); Dingsheng Lin, Venetia, PA (US)

(73) Assignee: ANSYS, Inc., Canonsburg, PA (US)

( * ) Notice: Subject to any disclaimer, the term of this patent is extended or adjusted under 35 U.S.C. 154(b) by 599 days.

(21) Appl. No.: 14/796,374

(22) Filed: Jul. 10, 2015

Related U.S. Application Data

(60) Provisional application No. 62/024,254, filed on Jul. 14, 2014.

(51) Int. Cl.
| | | |
|---|---|---|
| G06G 7/48 | (2006.01) | |
| G06F 17/50 | (2006.01) | |
| H01F 41/02 | (2006.01) | |
| G01R 33/00 | (2006.01) | |
| H01F 1/36 | (2006.01) | |
| G01R 33/14 | (2006.01) | |

(52) U.S. Cl.
CPC .................................. *G01R 33/14* (2013.01)

(58) Field of Classification Search
CPC ....................... G01R 33/1215; G01R 33/0064; G01R 33/14; G06F 17/5018; G06F 17/5009; H01F 41/0246
See application file for complete search history.

(56) References Cited

U.S. PATENT DOCUMENTS

2013/0073270 A1\* 3/2013 Furuya ............... G01R 33/0064
703/6

OTHER PUBLICATIONS

Matsuo, et al., "Representation of minor hysteresis loops of a silicon steel sheet using stop and play models," Elsevier B.V.; Science Direct, Physica B 372; pp. 25-29 (2006).\*

\* cited by examiner

*Primary Examiner* — Brian Turner
(74) *Attorney, Agent, or Firm* — Jones Day

(57) ABSTRACT

Systems and methods are provided for analyzing magnetic hysteresis. A reversible component associated with an applied magnetic field is determined for establishing a series-distributed model. One or more hysteresis loops are generated for analyzing magnetic hysteresis of a magnetic material.

25 Claims, 20 Drawing Sheets

SYSTEMS AND METHODS FOR VECTOR HYSTERESIS ANALYSIS

CROSS REFERENCE TO RELATED APPLICATIONS

This application claims priority to U.S. Patent Application No. 62/024,254, entitled "Systems and Methods for Vector Hysteresis Analysis," filed Jul. 14, 2014, the entirety of which is herein incorporated by reference.

TECHNICAL FIELD

The present disclosure relates generally to the field of computational simulations, and, more specifically, to processor-implemented systems and methods for finite element analysis.

BACKGROUND

The phenomenon of magnetic hysteresis has been observed for a long time in various magnetic materials which are widely used in electrical devices. For example, when an external magnetic field is applied to a ferromagnetic material (e.g., iron), atomic dipoles within the ferromagnetic material align with the magnetic field. When the external magnetic field is removed, part of the alignment may be retained as the ferromagnetic material has become magnetized. To demagnetize the ferromagnetic material, heat or a magnetic field in the opposite direction may need to be applied. Particularly, the relationship between field strength H and magnetization M is not linear in the ferromagnetic material. If the ferromagnetic material is demagnetized (e.g., H=M=0) and the relationship between H and M is plotted for increasing levels of field strength, M may follow an initial magnetization curve which increases rapidly at first and then approaches an asymptote called magnetic saturation. If the magnetic field is then reduced monotonically, M follows a curve different from the initial magnetization curve. At zero field strength, the magnetization is offset from the origin by a certain amount. If the H-M relationship is plotted for all strengths of the applied magnetic field, the result shows a hysteresis loop that is called a main loop. Magnetic hysteresis loops are not exclusive to materials with ferromagnetic ordering. Other magnetic orderings, such as spin glass ordering, also exhibit this phenomenon.

SUMMARY

As disclosed herein, processor-implemented systems and methods are provided for analyzing magnetic hysteresis of a magnetic material. An example system includes: one or more data processors and a non-transitory computer-readable storage medium. The data processors are configured to: determine an initial reversible component of a magnetic field applied to a magnetic material; determine a first reversible component based at least in part on the initial reversible component; determine a flux density; and generate one or more hysteresis loops based at least in part on the flux density for analyzing magnetic hysteresis of the magnetic material. The non-transitory computer-readable storage medium is configured to store data related to the first reversible component, data related to the flux density, and data related to the hysteresis loops.

As an example, a processor-implemented system is provided for analyzing magnetic hysteresis of a magnetic material. The system includes: one or more data processors and a non-transitory computer-readable storage medium. The data processors are configured to: determine a plurality of flux densities associated with a magnetic material; determine a plurality of first magnetic fields based at least in part on the flux densities; determine a total magnetic field based on a weighted sum of the first magnetic fields; generate one or more hysteresis loops based at least in part on the total magnetic field for analyzing magnetic hysteresis of the magnetic material. The non-transitory computer-readable storage medium is configured to store data related to the flux densities, data related to the first magnetic fields, and data related to the total magnetic field.

As another example, a processor-implemented method is provided for analyzing magnetic hysteresis of a magnetic material. The method includes: determining, using one or more data processors, an initial reversible component of a magnetic field applied to a magnetic material; determining, using the one or more data processors, a first reversible component based at least in part on the initial reversible component using a vector play model; determining, using the one or more data processors, a flux density; and generating, using the one or more data processors, one or more hysteresis loops based at least in part on the flux density for analyzing magnetic hysteresis of the magnetic material.

As yet another example, a processor-implemented method is provided for analyzing magnetic hysteresis of a magnetic material. The method includes: determining, using one or more data processors, a plurality of flux densities associated with a magnetic material; determining, using the one or more data processors, a plurality of first magnetic fields based at least in part on the flux densities; determining, using the one or more data processors, a total magnetic field based on a weighted sum of the first magnetic fields; and generating, using the one or more data processors, one or more hysteresis loops based at least in part on the total magnetic field for analyzing magnetic hysteresis of the magnetic material.

For example, a non-transitory computer readable storage medium comprises programming instructions for analyzing magnetic hysteresis of a magnetic material. The programming instructions are configured to cause one or more data processors to execute operations, including: determining an initial reversible component of a magnetic field applied to a magnetic material; determining a first reversible component based at least in part on the initial reversible component using a vector play model; determining a flux density; and generating one or more hysteresis loops based at least in part on the flux density for analyzing magnetic hysteresis of the magnetic material.

In another example, a non-transitory computer readable storage medium comprises programming instructions for analyzing magnetic hysteresis of a magnetic material. The programming instructions are configured to cause one or more data processors to execute operations, including: determining a plurality of flux densities associated with a magnetic material; determining a plurality of first magnetic fields based at least in part on the flux densities; determining a total magnetic field based on a weighted sum of the first magnetic fields; generating one or more hysteresis loops based at least in part on the total magnetic field for analyzing magnetic hysteresis of the magnetic material.

DETAILED DESCRIPTION

Figure 1:
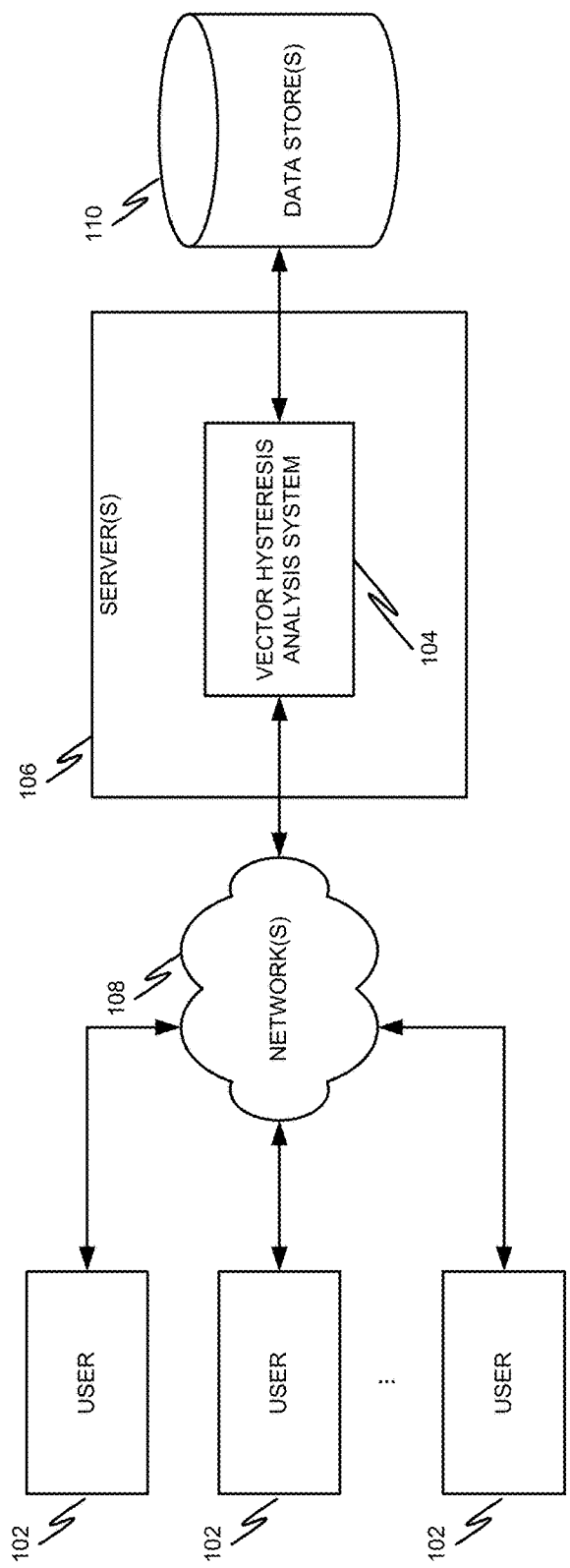
FIG. 1 depicts an example computer-implemented environment wherein users can interact with a vector hysteresis analysis system hosted on one or more servers through a network.

FIG. 1 depicts an example computer-implemented environment wherein users 102 can interact with a vector hysteresis analysis system 104 hosted on one or more servers 106 through a network 108. The vector hysteresis analysis system 104 can assist the users 102 to generate a vector hysteresis model for analyzing magnetic hysteresis of a magnetic material (e.g., to predict the magnetic hysteresis behavior of the magnetic material).

As shown in FIG. 1, the users 102 can interact with the vector hysteresis analysis system 104 through a number of ways, such as over one or more networks 108. One or more servers 106 accessible through the network(s) 108 can host the vector hysteresis analysis system 104. The one or more servers 106 can also contain or have access to one or more data stores 110 for storing data for the vector hysteresis analysis system 104.

The vector hysteresis analysis system 104 determines the vector hysteresis model that satisfy certain properties or basic rules: i) a saturation property (e.g., magnetization being limited to saturation for any magnetizing process); ii) a reduction property (e.g., the vector hysteresis model being reduced to a scalar model for a large field applied in a fixed direction if a magnetic material is originally demagnetized); iii) a rotational symmetry property (e.g., a locus of magnetization vector tip tracing out a circle for any rotating field); iv) a rotational loss property (e.g., the hysteresis loss approaching zero for large rotating fields).

Specifically, the vector hysteresis analysis system 104 determines a specific vector play operator for the vector hysteresis model to satisfy the rotation loss property beyond saturation. The specific vector play operator for the vector hysteresis model determined by the vector hysteresis analysis system 104 is different from the ordinary vector play operator for the ordinary vector play model which is derived from a scalar play model.

A. Scalar Play Model

The output of the scalar play model is given by:

$$m(t) = \sum_{k=1}^{n} f_k(h_{rek}(t)) \quad (1)$$

where $f_k(\cdot)$'s correspond to one or more anhysteretic nonlinear functions. The scalar model implements a scalar play operator $h_{rek}$ given by:

$$h_{rek}(t) = P_{\sigma k}[h_k(t)] \quad (2)$$

Figure 2:
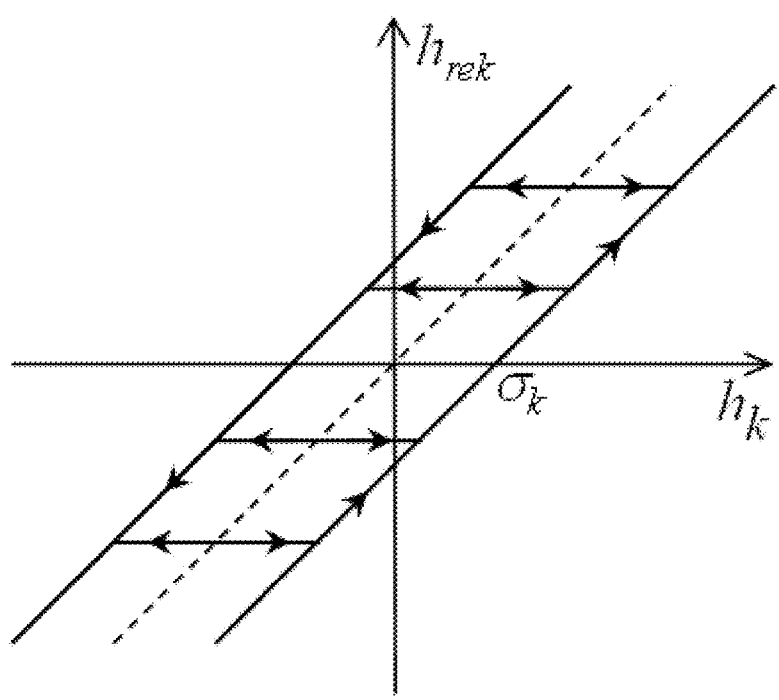
FIG. 2 depicts an example diagram showing a scalar play operator.

The scalar play operator $h_{rek}$ is shown in FIG. 2. The input of the scalar play model includes an applied field intensity $h_k$ given by:

$$h_k(t) = h(t) \quad k=1,2,\ldots,n \quad (3)$$

One or more returned values of the scalar play operator are bounded within two parallel limit lines (e.g., an ascending limit line and a descending limit line), as shown in FIG. 2. A flux density b(t) is obtained as follows:

$$b(t) = \mu_0(m(t) + h(t)) = \sum_{k=1}^{n} b_k(t) \quad (4)$$

where $$b_k(t) = \mu_0(f_k(h_{rek}(t)) + h(t)) = b_{rek}(t) + \mu_0(h_k(t) - h_{rek}(t)) \quad (5)$$

with $$b_{rek}(t) = \mu_0(f_k(h_{rek}(t)) + h_{rek}(t)) \quad (6)$$

Figure 3:
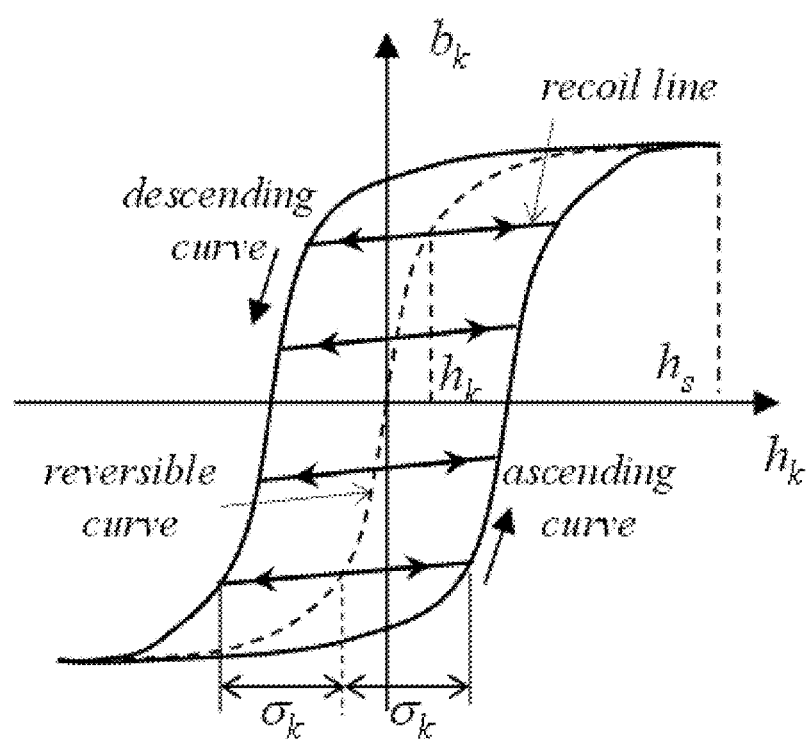
FIG. 3 depicts an example diagram showing a b-h curve of a play hysteron.
Figure 4:
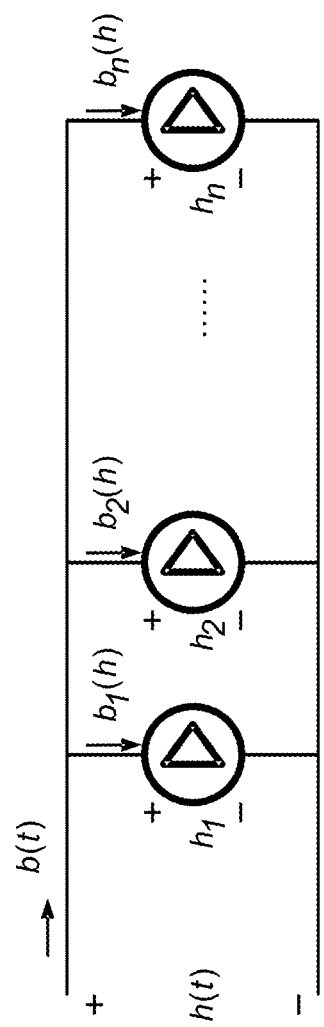
FIG. 4 depicts an example diagram showing a parallel-connected circuit for scalar play hysterons.

The flux density $b_k(t)$ of a play hysteron is shown in FIG. 3. When the applied field $h_k(t)$ increases, $b_k(t)$ tracks the ascending curve. If $h_k(t)$ decreases, $b_k(t)$ tracks a recoil line first, then tracks the descending curve. All recoil lines have a same slope of $\mu_0$. The output b(t) can be seen as the total contribution of n play hysterons. If each hysteron is represented by a circuit element with h denoting a "cross" quantity and b a "through" quantity, Equation (3) may be expressed by a parallel-connected circuit, as shown in FIG. 4. If the applied field $h_k$ is decomposed into two components—a reversible component and an irreversible component, then the scalar play operator $h_{rek}$ represents the reversible component, and $h_k - h_{rek}$ stands for the irreversible component $h_{irk}$ which satisfies:

$$|h_k - h_{rek}| \leq \sigma_k \quad (7)$$

where $\sigma_k$ represents an intrinsic coercivity for a k-th play hysteron.

The parameters of the scalar play model to be identified include one or more anhysteretic curves $f_k(\cdot)$, $k=1, 2, \ldots, n$, which are identified by letting the curves derived from the scalar play model best match the measured ones. In order to identify all these anhysteretic curves, a prohibitive experimental effort is often needed, and the identification process may also be quite complicated.

B. Ordinary Vector Play Operator

In some embodiments, the scalar play operator $h_{rek}$ as shown in FIG. 2 is expressed as:

$$h_{rek} = \max(\min(h_{rek0}, h_k + \sigma_k), h_k - \sigma_k) \quad (8)$$

or $$h_{rek} = h_k - \frac{\sigma_k(h_k - h_{rek0})}{\max(\sigma_k, |h_k - h_{rek0}|)} \quad (9)$$

where $h_{rek0}$ represents an initial value of $h_{rek}$.

The scalar play operator $h_{rek}$ expressed in Equation (9) is extended for a vector field as:

$$h_{rek} = h_k - \frac{\sigma_k(h_k - h_{rek0})}{\max(\sigma_k, |h_k - h_{rek0}|)} \quad (10)$$

or $$h_{rek} = \begin{cases} h_{rek0} & \text{if } |h_k - h_{rek0}| < \sigma_k \\ h_k - \sigma_k \cdot \frac{h_k - h_{rek0}}{|h_k - h_{rek0}|} & \text{if } |h_k - h_{rek0}| \geq \sigma_k \end{cases} \quad (11)$$

Figure 5:
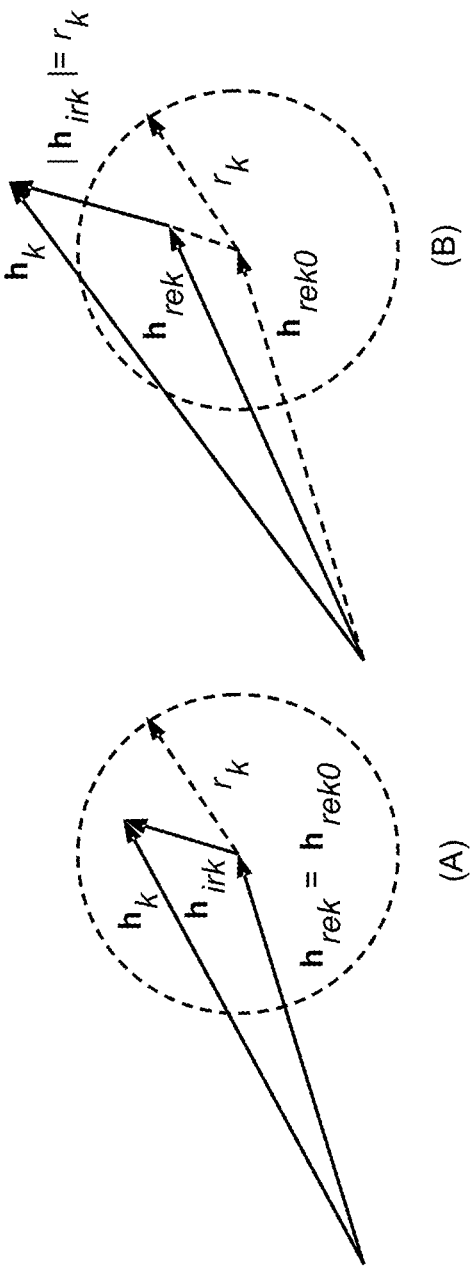
FIG. 5 depicts an example diagram showing an ordinary vector play operator.

The ordinary vector play operator $h_{rek}$ is illustrated by a vector diagram as shown in FIG. 5. A circle can be drawn at the tip of the vector $h_{rek0}$ with a radius $r_k = \sigma_k$. If the tip of the applied field $h_k$ falls inside the circle, a reversible component $h_{rek}$ is kept unchanged (e.g., equal to an initial vector $h_{rek0}$), as shown in FIG. 5(A). On the other hand, if the tip of the applied field $h_k$ falls outside the circle, an irreversible component $h_{irk}$ is set in the direction of $h_k - h_{rek0}$ with a length of $r_k$, and then the reversible component $h_{rek}$ is set as $h_{rek} = h_k - h_{irk}$, as shown in FIG. 5(B). Parameters for the ordinary vector play model associated with FIG. 5 are the same as those for the scalar play model described above, and therefore can be identified based on the scalar play model.

As shown in FIG. 5, if the applied field $h_k$ rotates, at a steady state, the irreversible component $h_{irk}$ is perpendicular to the reversible component $h_{rek}$. As an example, in the ordinary vector play operator as shown in FIG. 5, the magnitude of $h_{irk}$ is constant no matter how large the applied field $h_k$ is, which means $m_k$, in the same direction of $h_{rek}$, lags $h_k$ a certain angle. The ordinary vector play model described above may not satisfy the rotational loss property that the magnetic hysteresis loss of any applied rotating magnetic field approaches zero when the magnitude of the applied rotating magnetic field becomes saturated.

C. Specific Vector Play Operator

In order to satisfy the rotational loss property for any vector play hysteron, the irreversible field component may need to be zero when the applied field is beyond a saturation field $h_s$. The vector hysteresis analysis system 104 determines a specific vector play operator $h_{rek}$ as:

$$h_{rek} = \begin{cases} h_{rek0} & \text{if } |h_k - h_{rek0}| < r_k(h_{rek}) \\ h_k - r_k(h_{rek}) \cdot \frac{h_k - h_{rek0}}{|h_k - h_{rek0}|} & \text{if } |h_k - h_{rek0}| \geq r_k(h_{rek}) \end{cases} \quad (12)$$

where $$r_k(h_{rek}) = \begin{cases} \sigma_k & \text{if } |h_{rek}| \leq (h_s - \sigma_k) \\ h_s - |h_{rek}| & \text{if } (h_s - \sigma_k) < |h_{rek}| \leq h_s \\ 0 & \text{if } |h_{rek}| > h_s \end{cases} \quad (13)$$

Figure 6:
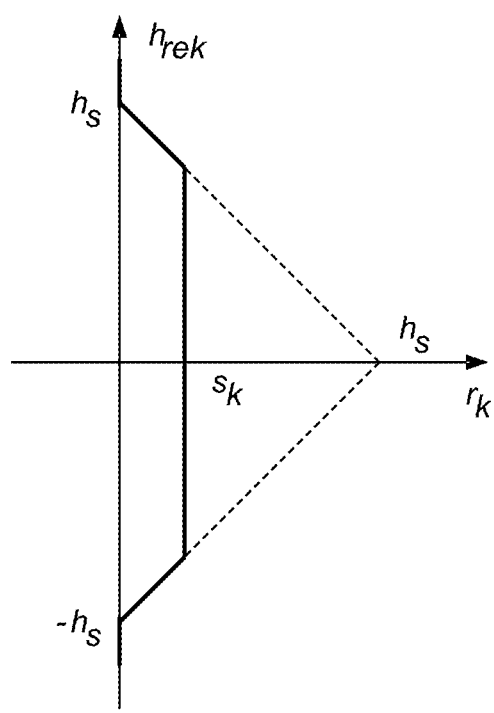
FIG. 6 depicts an example diagram showing an irreversible component as a function of a reversible component.
Figure 7:
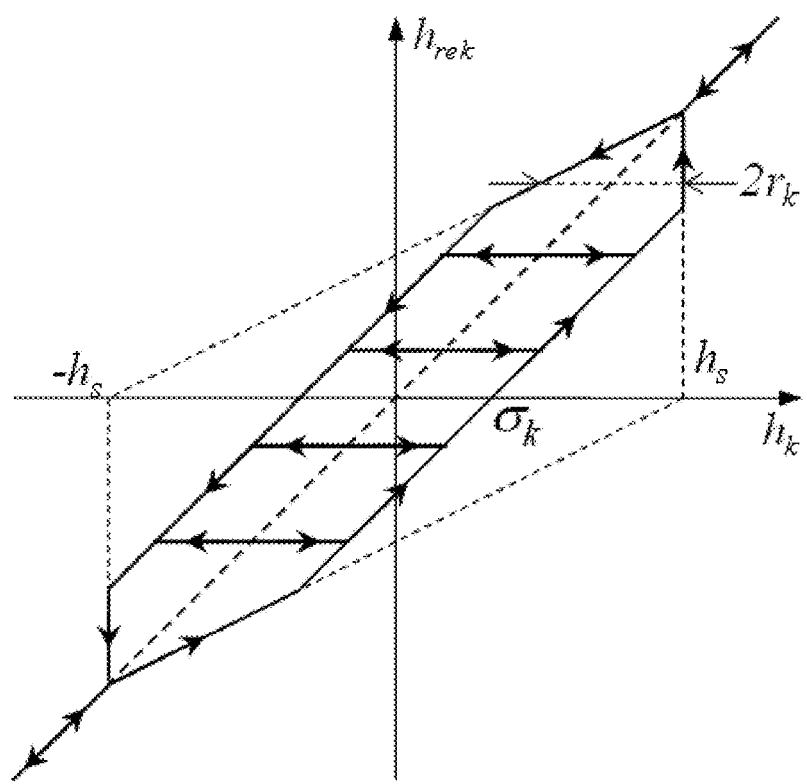
FIG. 7 depicts an example diagram showing a specific vector play operator.

$r_k(h_{rek})$ is shown in FIG. 6. The specific vector play operator $h_{rek}$ (e.g., considering the saturation behavior) is shown in FIG. 7.

D. Variable Slope for Recoil Lines

Referring back to FIG. 3, for the scalar play operator (or the ordinary vector play operator), all recoil lines inside the hysteresis loop have the same slope of $\mu_0$, which may cause the area of a minor hysteresis loop bounded within a major hysteresis loop and two parallel recoil lines to be larger than a measured one. In order to more accurately represent individual minor loop behavior, the vector hysteresis analysis system 104 introduces a variable slope algorithm so that the area of a derived minor loop can best match the area of a measured minor loop.

Figure 8:
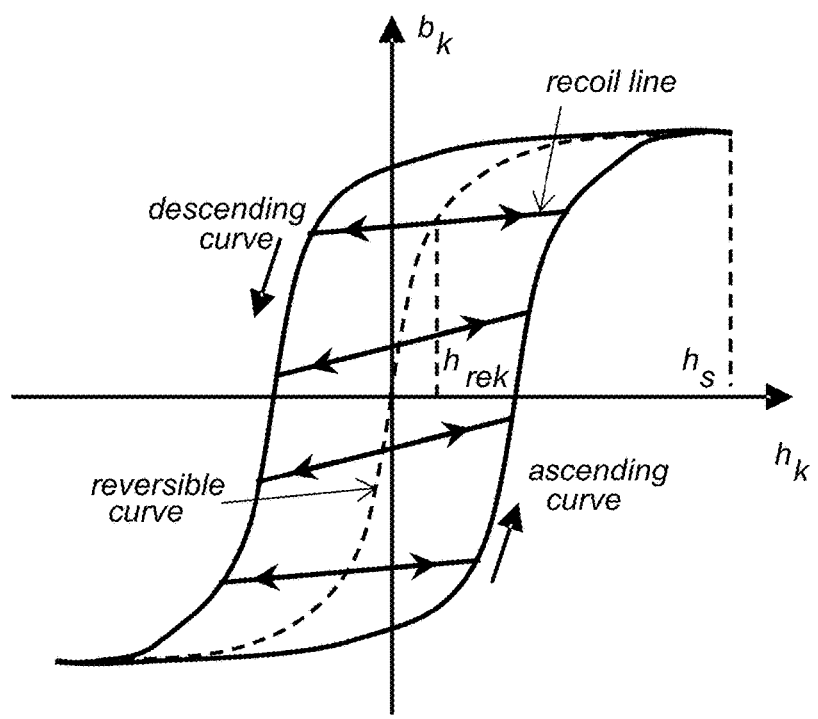
FIG. 8 depicts an example diagram showing recoil lines with variable slopes.

Particularly, the hysteresis analysis system 104 constructs a slope of a recoil line as a linear function of a slope of a tangent line of a reversible curve at an intersection with the recoil line, as shown in FIG. 8. For example, assuming that a recoil line intersects the reversible curve at $h_{rek}$, the slope of the tangent line is given by:

$$\tilde{\mu} = \frac{df_k(h)}{dh}\bigg|_{h=h_{rek}} = \tilde{\mu}_r \mu_0 \quad (14)$$

The slope of the recoil line is given by:

$$\mu = k_\mu(\tilde{\mu} - \mu_0) + \mu_0 = (k_\mu(\tilde{\mu}_r - 1) + 1)\mu_0 \quad (15)$$

where $k_\mu$ represents a parameter to be identified. When $k_- = 0$, the slope of all recoil lines becomes constant, the vector hysteresis model determined by the hysteresis analysis system 104 degrades to the ordinary vector play model associated with FIG. 3. Accordingly, $r_k$ is modified as:

$$r_k(h_{rek}) = \begin{cases} \frac{1}{1-k_\mu}\sigma_k & \text{if } |h_{rek}| \leq (h_s - \sigma_k) \\ \frac{1}{1-k_\mu}(h_s - |h_{rek}|) & \text{if } (h_s - \sigma_k) < |h_{rek}| \leq h_s \\ 0 & \text{if } |h_{rek}| > h_s \end{cases} \quad (16)$$

Figure 9:
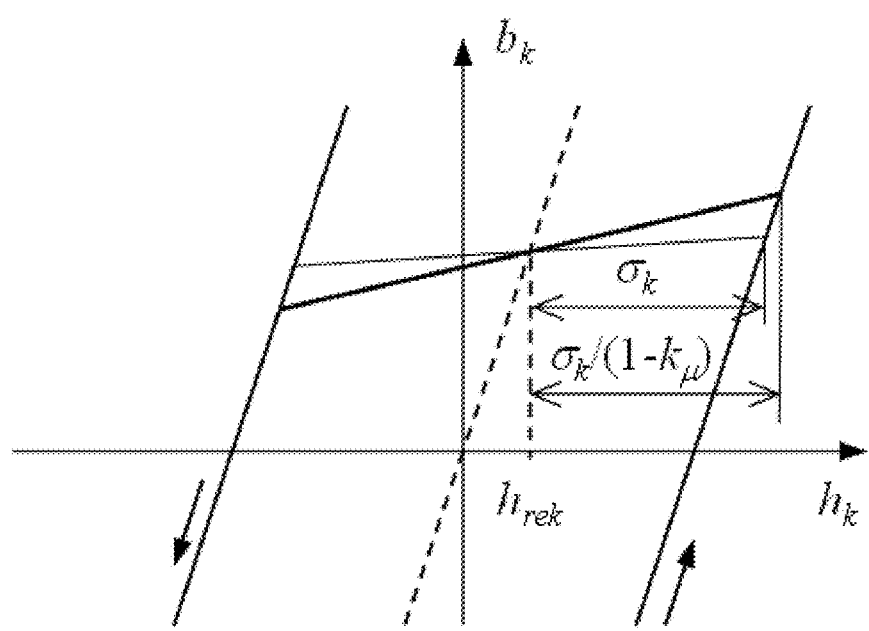
FIG. 9 depicts an example diagram showing irreversible limit modified based on recoil line slopes.

The modified $r_k(h_{rek})$ is shown in FIG. 9.

After $h_{rek}$ is determined by the specific vector play operator (e.g., as determined by Equation (12)), a reversible flux density $b_{rek}$ is computed from Equation (6) with the direction of $h_{rek}$. The flux density is given by:

$$b_k(t) = b_{rek}(t) + \mu(h_{rek})(h_k(t) - h_{rek}(t)) \quad (17)$$

E. Local Iteration Algorithm

The vector hysteresis analysis system 104 introduces a local iteration algorithm, which allows either deriving the applied magnetic field $h_k$ from the flux density $b_k$ or deriving the flux density $b_k$ from the applied magnetic field $h_k$, for numerical stability that is considered as one of the most challenging issues for practical applications. For example, the vector hysteresis analysis system 104 introduces the local iteration algorithm to efficiently locate an operating point on hysteresis loops in addition to a global iteration algorithm (e.g., a Newton-Raphson global nonlinear iteration algorithm). Specifically, Equation (12) is solved to derive $h_{rek}$ from $h_k$. Since $r_k$ in Equation (16) depends on $h_{rek}$, a local iterating process is performed.

In some embodiments, the vector hysteresis analysis system 104 derives the flux density $b_k$ from the applied magnetic field $h_k$. When the applied field $h_k$ locates inside the circle as shown in FIG. 5(A), $h_{rek}$ is kept the same as the initial value $h_{rek0}$. On the other hand, when the applied field $h_k$ locates outside the circle as shown in FIG. 5(B), $h_{rek}$ is derived according to the following iteration process:
1) Assume $h_{rek} = h_{rek0}$;
2) Obtain $h_{irk}$ from $r_k$ by Equation (16) and the direction of $(h_k - h_{rek0})$;
3) Calculate $\Delta h = h_k - (h_{rek} + h_{irk})$;
4) Let $h_{rek} = h_{rek} + \alpha \Delta h$;
5) Repeat operations 2)-4) until $|\Delta h|/h_s < \varepsilon$.

In the above iterating process, $\alpha$ represents a relaxation factor which can be optimized based on the historic iterating results, and $\varepsilon$ represents a given tolerance. After $h_{rek}$ is obtained, $b_k$ is computed according to Equation (17) and Equation (6).

Figure 10:
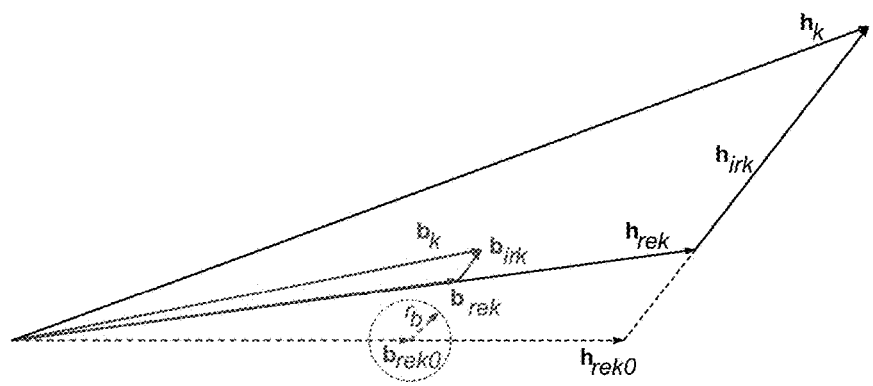
FIG. 10 depicts an example diagram showing a vector diagram for deriving a magnetic field from a flux density.

In certain embodiments, the vector hysteresis analysis system 104 derives the applied magnetic field $h_k$ from the flux density $b_k$. That is, Equation (12) is solved inversely. A vector $b_{rek0}$ and $\mu$ are obtained from $h_{rek0}$, and a circle is drawn at the tip of the vector $b_{rek0}$ with a radius of $r_b = \mu r_k$ ($h_{rek0}$), as shown in FIG. 10. When the tip of the vector $b_k$ locates inside the circle, $h_{rek}$ is kept the same as the initial value $h_{rek0}$. On the other hand, when the tip of the vector $b_k$ locates outside the circle as shown in FIG. 10, another iteration process is performed:
1) Assume $b_{rek} = b_k$;
2) Obtain $h_{rek}$ from $b_{rek}$ based on a reversible b-h curve according to Equation (6);
3) Obtain $\mu$ from $h_{rek}$ based on Equation (15);
4) Obtain $h_{irk}$ from $r_k$ by Equation (16) and the direction of $(h_{rek} - h_{rek0})$;
5) Let $b_{irk} = \mu h_{irk}$;
6) Calculate $\Delta b = b_k - (b_{rek} + b_{irk})$;
7) Let $b_{rek} = b_{rek} + \alpha \Delta b$;
8) Repeat operations 2)-7) until $|A\alpha|/b_s < \varepsilon$, where $b_s$ represents the flux density at $h_s$.

After $h_{rek}$ is obtained, $h_k$ is computed as follows:

$$h_k(b_k) = h_{rek} + (b_k - b_{rek})/\mu \tag{18}$$

F. Series-Distributed Model

Furthermore, the vector hysteresis analysis system 104 generates a series-distributed hysteron model for analyzing magnetic materials (e.g., predicting magnetization behavior of the magnetic materials). Particularly, to satisfy the rotational loss property, the b-h hysteresis loop associated with the specific play operator is discontinued at $h = \pm h_s$ for each play hysteron, as shown in FIG. 7. The series-distributed hysteron model based on series-distributed play hysterons accommodates the specific vector play operator and the variable slope algorithm described above so as to reduce any possible discontinuity. For example, the series-distributed play model is used according to the variable slope algorithm for recoil lines and the local iteration algorithm for deriving $h_k$ from $b_k$ for each play hysteron.

Figure 11:
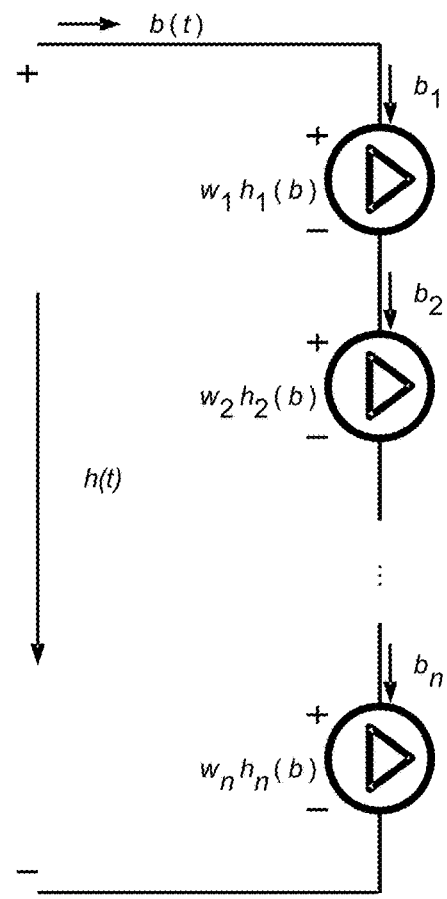
FIG. 11 depicts an example diagram showing a series-connected circuit for play hysterons.
Figure 12:
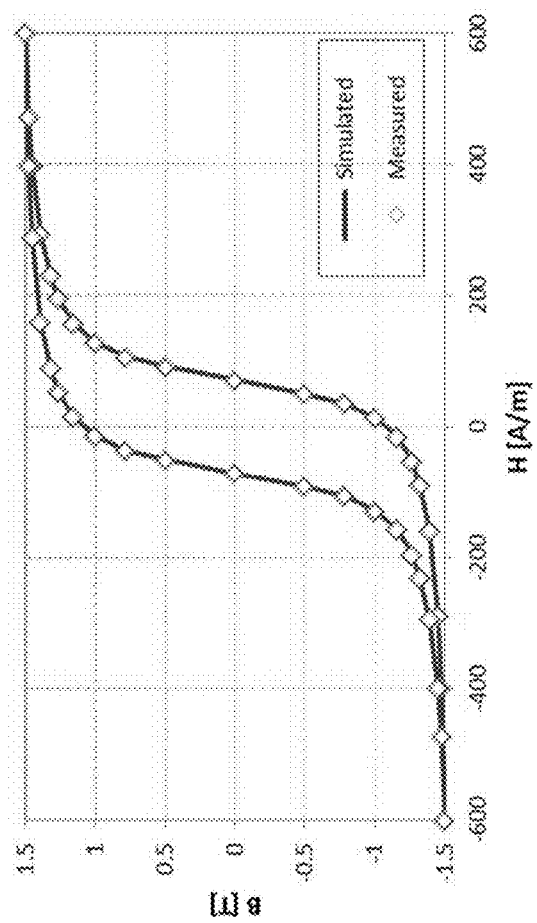
FIG. 12 depicts an example diagram showing a comparison between simulated results derived from the vector hysteresis model and measured data.
Figure 13:
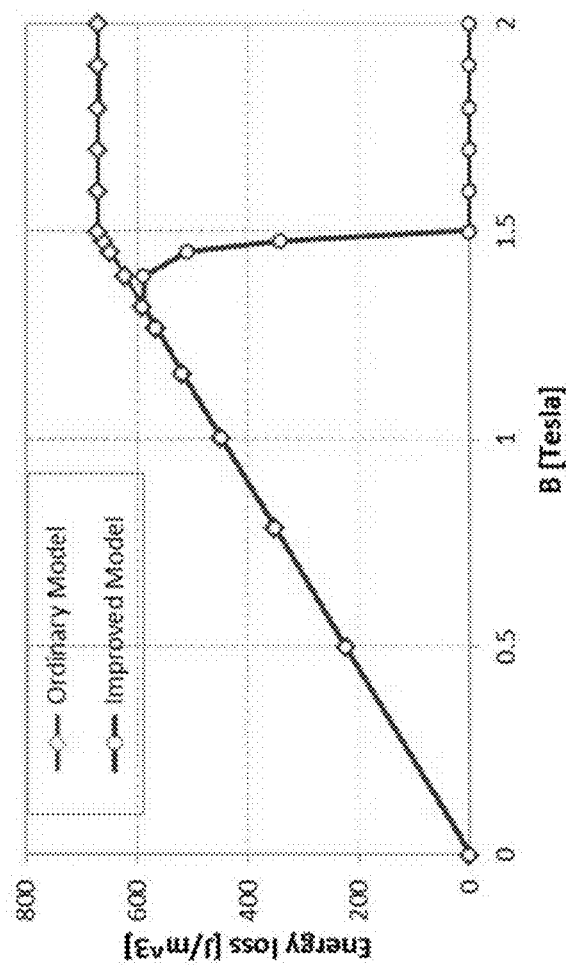
FIG. 13 depicts an example diagram showing a comparison between simulated results of rotational losses derived from the vector hysteresis model and simulated results derived from the ordinary vector play model.

In Equation (18), the applied field $h_k$ is expressed as a function of the flux density $b_k$ for the k-th play hysteron. For series connection, $b_1 = b_2 = \ldots = b_n = b$, and thus, the total applied field for the series-distributed play hysterons can be expressed as follows:

$$h(t) = \sum_{k=1}^{n} w_k h_k(b) \tag{19}$$

where the parameters $w_k$ represent weighting factors for all play hysterons. The series-connected circuit is shown in FIG. 11. FIG. 12 depicts an example diagram showing a comparison between simulated results derived from the vector hysteresis model and measured data. FIG. 13 depicts an example diagram showing a comparison between simulated results of rotational losses derived from the vector hysteresis model and simulated results derived from the ordinary vector play model.

G. Parameter Identification

With the introduction of the series-distributed model, all play hysterons can have a same reversible nonlinear b-h curve. As a result, a parameter identification process, as an integral function of the vector hysteresis analysis system 104, may be simplified. In some embodiments, the vector hysteresis analysis system 104 performs parameter identification for the series-distributed hysteron model (e.g., based on available measured data). For example, the measured data are directly available from the manufacture of the magnetic materials. In some embodiments, all play hysterons associated with the series-distributed model can have a same reversible nonlinear b-h curve so that the parameter identification process is greatly simplified.

The parameters of the vector hysteresis model include: i) a reversible nonlinear b-h curve for all play hysterons; ii) a coefficient $k_\mu$ for variable slope of recoil lines; iii) a weighting factor for each play hysteron. These parameters can be identified based on a normal b-h curve and a major hysteresis loop.

The reversible nonlinear b-h curve is obtained from a reversible nonlinear m-h curve which can in turn be derived from a center line of an m-h major hysteresis loop. The major hysteresis loop includes an ascending curve $m_{asd}(h)$ and a descending curve $m_{dsc}(h)$. The ascending curve, or the descending curve can be directly obtained from each other based on the odd symmetry condition. Only one curve is needed from input, according to some embodiments.

Figure 14:
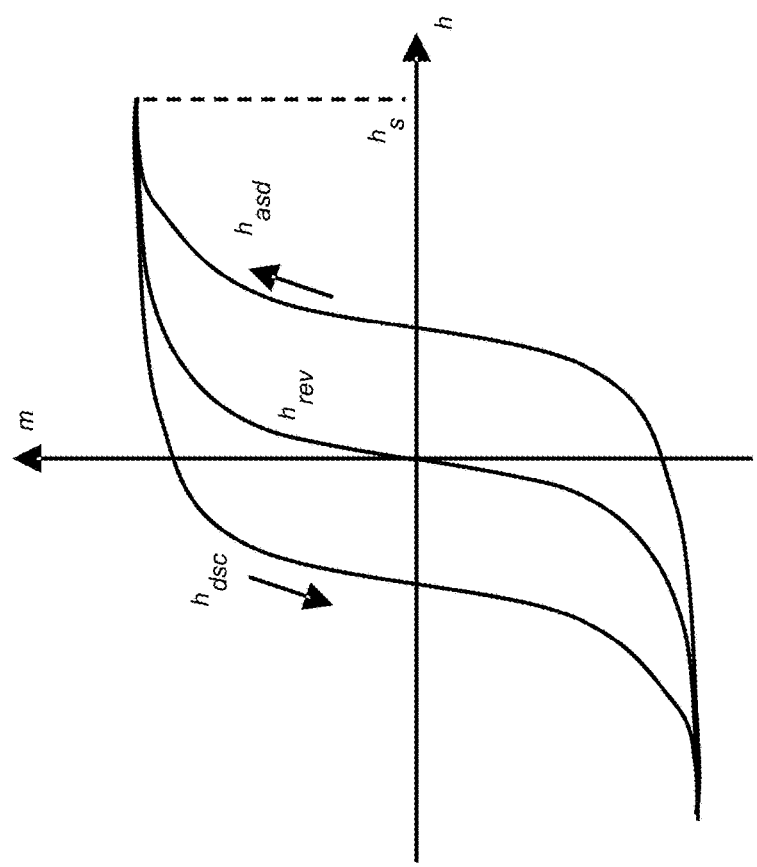
FIG. 14 depicts an example diagram showing a reversible nonlinear m-h curve identified from ascending and descending curves.

In certain embodiments, the inverse functions of $m_{asd}(h)$ and $m_{dsc}(h)$ are denoted as $h_{asd}(m)$ and $h_{dsc}(m)$, respectively, as shown in FIG. 14. The reversible nonlinear m-h curve is determined from:

$$h_{rev}(m) = (h_{asd}(m) + h_{dsc}(m))/2 \tag{20}$$

If the inverse function of $h_{rev}(m)$ is expressed as $m_{rev}(h)$, then the reversible nonlinear b-h curve can be obtained from:

$$b_{rev}(h) = \mu_0(m_{rev}(h) + h) \tag{21}$$

After the reversible nonlinear b-h curve is derived, the remaining parameters can be derived by making a derived (e.g., simulated) normal b-h curve and a derived (e.g., simulated) ascending curve of the major hysteresis loop best match to the input normal b-h curve and the input ascending curve of the major hysteresis loop respectively.

If $h_{rek0}$ starts from 0 and b sweeps from 0 to $b_s$, the derived normal b-h curve is derived based on the local iteration algorithm for deriving $h_k$ from $b_k$ with $b_k=b$ for all hysterons. If a sweep index is denoted as i, for a given value of $k_\mu$, $h_{ki}$ is obtained from $b_i$, and a total field $h_i$ of all play hysterons is determined as follows:

$$h_i = \sum_{k=1}^{n} w_k h_{ki} \qquad (22)$$

If a field on the input normal b-h curve at $b_i$ is denoted as $h_i'$, then a total error between the derived b-h curve and the input normal b-h curve for all sweepings is determined as follows:

$$e_{nor} = \sum_{i=1}^{m_1} \left( \sum_{k=1}^{n} w_k h_{ki} - h_i' \right)^2 \qquad (23)$$

where $m_1$ represents the number of sweeps for the normal b-h curve.

Similarly, if $h_{rek0}$ starts from $-h_s$ and b sweeps from $-b_s$ to $b_s$, the field on the derived ascending curve is obtained from the vector hysteresis model. If an index for the ascending curve sweep is counted from $m_1+1$ to $m=m_1+m_2$, the error between the derived ascending curve and the input ascending curve for all sweepings is determined as follows:

$$e_{asd} = \sum_{i=m_1+1}^{m} \left( \sum_{k=1}^{n} w_k h_{ki} - h_i' \right)^2 \qquad (24)$$

where $m_2$ represents the number of sweeps for the ascending curve.
To minimize the total error, that is, let $$\frac{\partial}{\partial w_j}(e_{nor} + e_{asd}) = 0 \quad j = 1, 2, \ldots, n \qquad (25)$$

The following equation is obtained:

$$\sum_{i=1}^{m} \left( \sum_{k=1}^{n} w_k h_{ki} - h_i' \right) h_{ji} = 0 \quad j = 1, 2, \ldots, n \qquad (26)$$

Or the following equation is obtained:

$$\begin{bmatrix} a_{11} & a_{12} & \cdots & a_{1n} \\ a_{21} & a_{22} & \cdots & a_{2n} \\ \vdots & \vdots & a_{kj} & \vdots \\ a_{n1} & n_{n2} & \cdots & a_{nn} \end{bmatrix} \cdot \begin{bmatrix} w_1 \\ w_2 \\ \vdots \\ w_n \end{bmatrix} = \begin{bmatrix} y_1 \\ y_2 \\ \vdots \\ y_n \end{bmatrix} \qquad (27)$$

where $$a_{kj} = \sum_{i=1}^{m} (h_{ki} h_{ji}) \quad k = 1, 2, \ldots, n; j = 1, 2, \ldots, n \qquad (28)$$

and $$y_j = \sum_{i=1}^{m} (h_i' h_{ji}) \quad j = 1, 2, \ldots, n \qquad (29)$$

After $w_k$ is solved from Equation (27), the total error, as a function of $k_\mu$, is obtained from:

$$err(k_\mu) = \sum_{i=1}^{m} \left( \sum_{k=1}^{n} w_k h_{ki} - h_i' \right)^2 \qquad (30)$$

For example, an optimal $k_\mu$ can be obtained by minimizing the total error using a one-variable numerical optimal process. In some embodiments, the vector hysteresis analysis system 104 combines a linear regression with a one-dimensional numerical optimization to minimize the total error to simplify the parameter identification of the vector hysteresis model.

Figure 15:
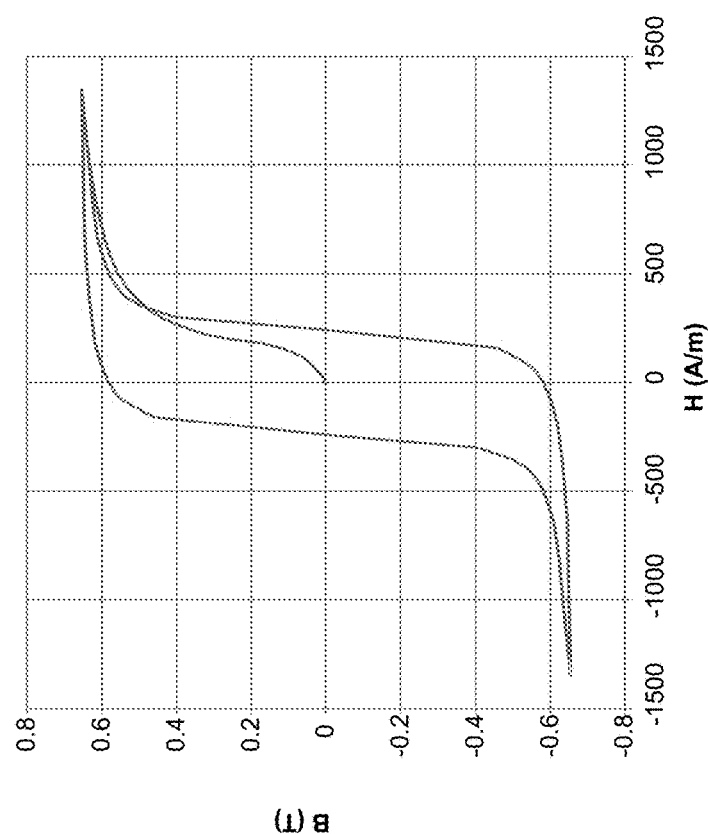
FIG. 15 depicts an example diagram showing an input normal b-h curve, an input ascending curve and an input descending curve for parameter identification of the vector hysteresis model.
Figure 16:
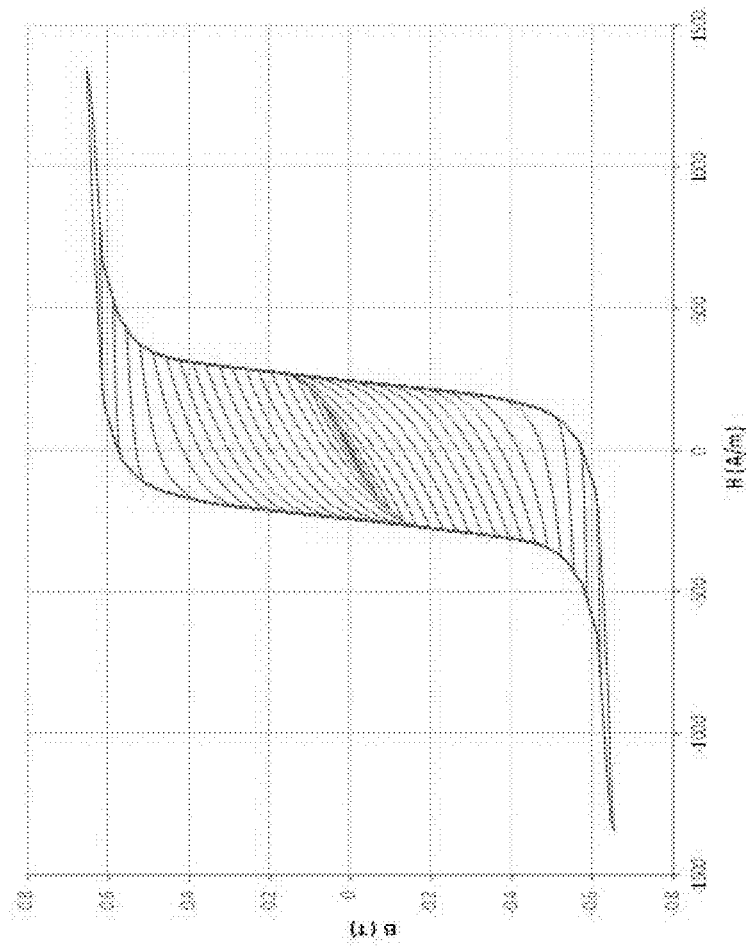
FIG. 16 depicts an example diagram showing symmetric minor loops and major loops derived from the vector hysteresis model based on identified parameters.

FIG. 15 depicts an example diagram showing an input normal b-h curve, an input ascending curve and an input descending curve for parameter identification of the vector hysteresis model. FIG. 16 depicts an example diagram showing symmetric minor loops and major loops derived from the vector hysteresis model based on identified parameters.

Figure 17:
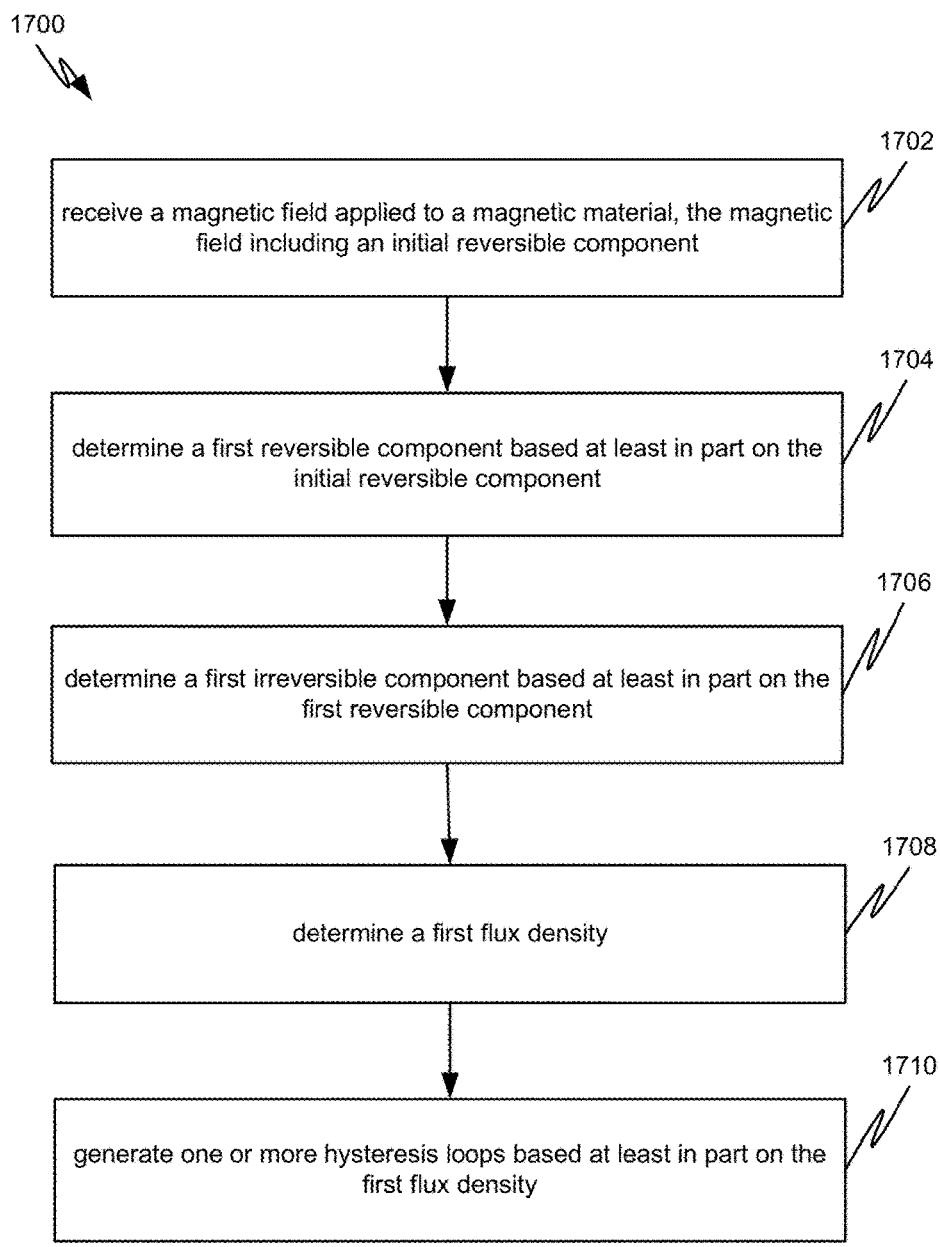
FIG. 17 depicts an example flow chart for vector hysteresis analysis of one hysteron.

FIG. 17 depicts an example flow chart for vector hysteresis analysis of one hysteron. At 1702, a magnetic field (e.g., $h_k$) applied to a magnetic material is received. The magnetic field includes an initial reversible component (e.g., $h_{rek0}$). At 1704, a first reversible component (e.g., $h_{rek}$) is determined based at least in part on the initial reversible component (e.g., $h_{rek0}$). At 1706, an irreversible component (e.g., $h_{irk}$) is determined based at least in part on the first reversible component (e.g., $h_{rek}$).

For example, a circle can be drawn at the tip of the initial reversible component (e.g., $h_{rek0}$) with a radius $r_k$ (e.g., $r_k=\sigma_k$). If the tip of the magnetic field (e.g., $h_k$) falls inside the circle, the first reversible component (e.g., $h_{rek}$) is kept unchanged (e.g., equal to the initial vector $h_{rek0}$). The irreversible component (e.g., $h_{irk}$) is determined to be $h_k-h_{rek}$. On the other hand, if the tip of the magnetic field (e.g., $h_k$) falls outside the circle, the irreversible component $h_{irk}$ is set in the direction of $h_k-h_{rek0}$ with a length of $r_k$, and then the first reversible component $h_{rek}$ is set as $h_k-h_{irk}$.

As an example, the irreversible component is approximately equal to a predetermined value (e.g., zero) when the applied magnetic field exceeds a saturation threshold (e.g., a saturation field $h_s$). At 1708, a flux density is determined. At 1710, one or more hysteresis loops are generated based at least in part on the flux density for analyzing magnetic hysteresis of the magnetic material.

Figure 18:
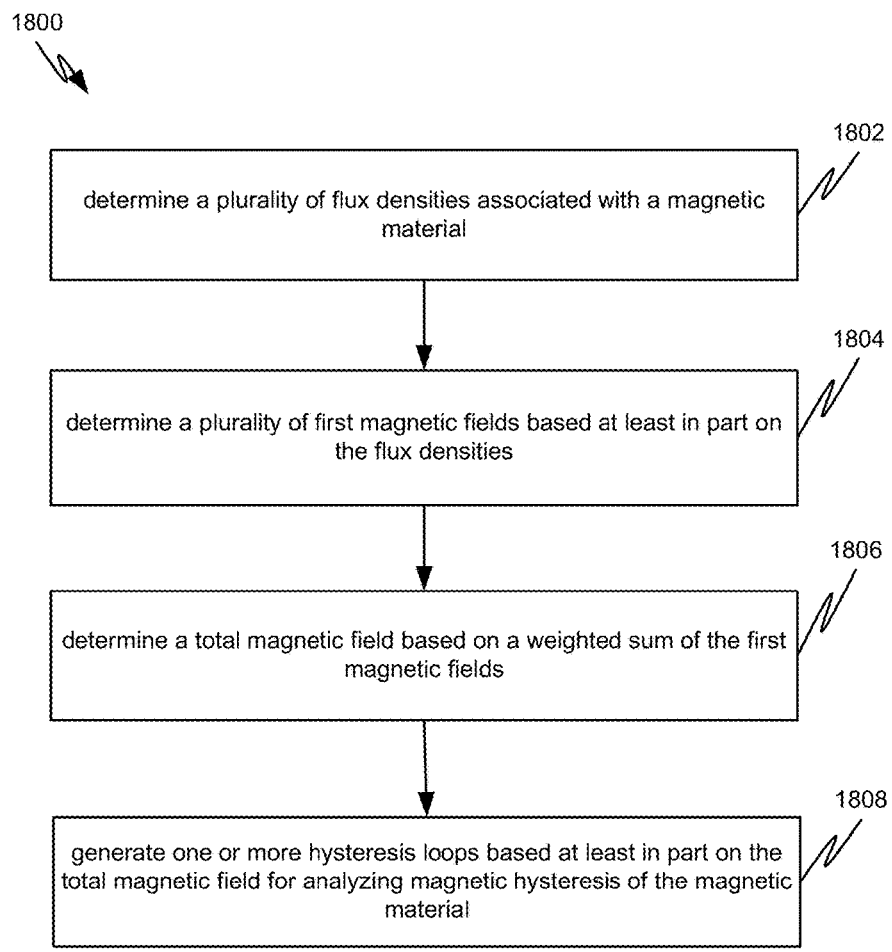
FIG. 18 depicts another example flow chart for vector hysteresis analysis.

FIG. 18 depicts another example flow chart for vector hysteresis analysis. At 1802, a plurality of flux densities associated with a magnetic material are determined. At 1804, a plurality of first magnetic fields are determined based at least in part on the flux densities. At 1806, a total magnetic field is determined based on a weighted sum of the first magnetic fields. At 1808, one or more hysteresis loops are based at least in part on the total magnetic field for analyzing magnetic hysteresis of the magnetic material.

Figure 19:
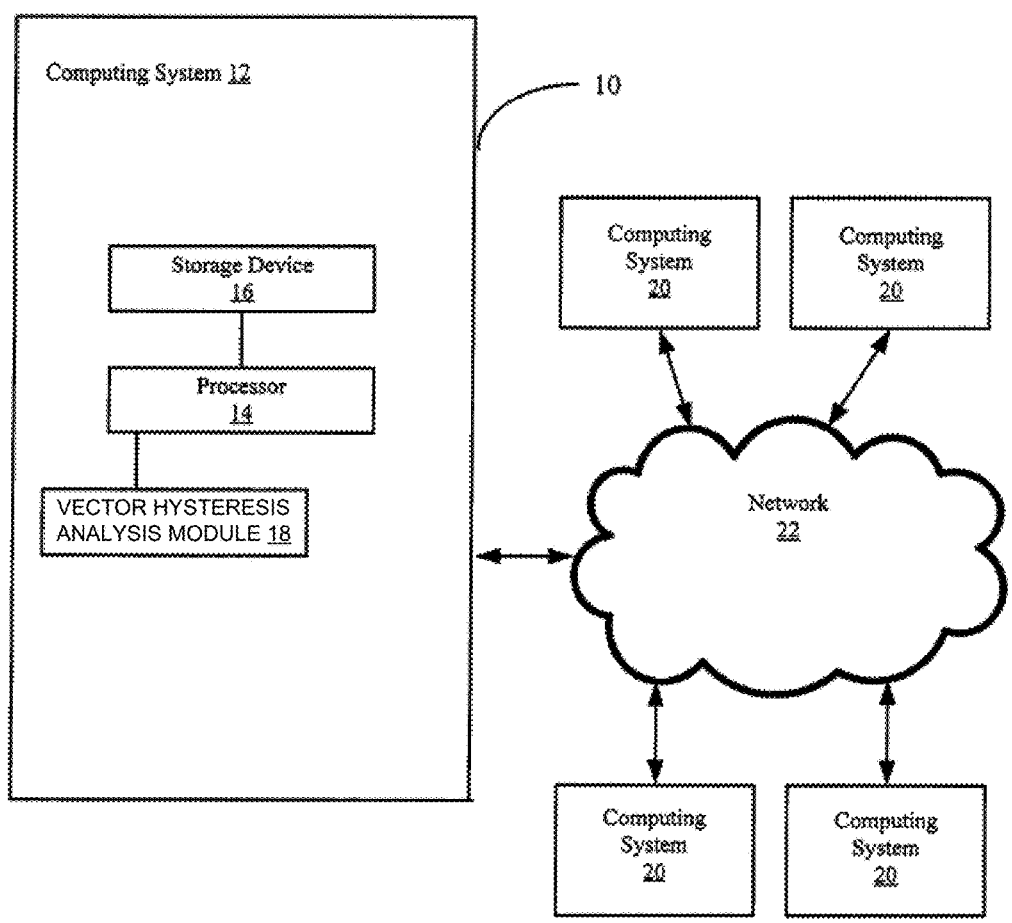
FIG. 19 depicts an example diagram showing a system for vector hysteresis analysis.

FIG. 19 depicts an example diagram showing a system for vector hysteresis analysis. As shown in FIG. 19, the system 10 includes a computing system 12 which contains a processor 14, a storage device 16 and a vector hysteresis analysis module 18. The computing system 12 includes any suitable type of computing device (e.g., a server, a desktop, a laptop, a tablet, a mobile phone, etc.) that includes the processor 14 or provide access to a processor via a network or as part of a cloud based application. The vector hysteresis analysis module 18 includes tasks and is implemented as part of a user interface module (not shown in FIG. 19).

Figure 20:
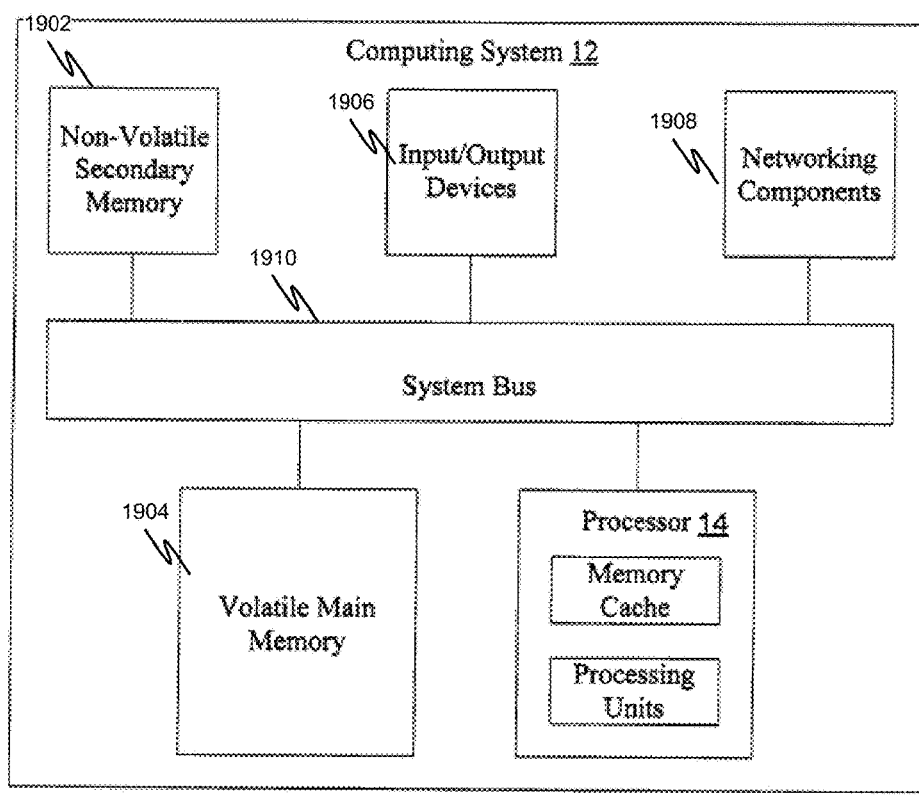
FIG. 20 depicts an example diagram showing a computing system for vector hysteresis analysis.

FIG. 20 depicts an example diagram showing a computing system for vector hysteresis analysis. As shown in FIG. 20, the computing system 12 includes a processor 14, memory devices 1902 and 1904, one or more input/output devices 1906, one or more networking components 1908, and a system bus 1910. In some embodiments, the computing system 12 includes the vector hysteresis analysis module 18, and provides access to the vector hysteresis analysis module 18 to a user as a stand-alone computer.

This written description uses examples to disclose the invention, including the best mode, and also to enable a person skilled in the art to make and use the invention. The patentable scope of the invention may include other examples. For example, the systems and methods disclosed herein are configured to improve computational efficiency by using less play hysterons in a vector hysteresis model.

For example, the systems and methods may include data signals conveyed via networks (e.g., local area network, wide area network, internet, combinations thereof, etc.), fiber optic medium, carrier waves, wireless networks, etc. for communication with one or more data processing devices. The data signals can carry any or all of the data disclosed herein that is provided to or from a device.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of non-transitory computer-readable storage medium that is stored at a single location or distributed across multiple locations. The medium can include computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example, as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

The invention claimed is:

1. A processor-implemented system for analyzing magnetic hysteresis of a magnetic material, the system comprising:
one or more data processors configured to:
determine an initial reversible component of a magnetic field applied to a magnetic material based on physical characteristics of the magnetic material that is to be built or modified;
determine a first reversible component based at least in part on the initial reversible component using a vector play model by selecting a specific vector play operator that (1) limits a magnitude of an irreversible component of the magnetic field to a maximum value to ensure that a rotational loss property is maintained in saturation and (2) maintains a correct total field for the determined first reversible component;
determine a flux density; and
generate one or more hysteresis loops based at least in part on the flux density for analyzing magnetic hysteresis of the magnetic material;
a non-transitory computer-readable storage medium configured to store data related to the first reversible component, data related to the flux density, and data related to the hysteresis loops for performing a simulation of behavior of the magnetic material, wherein a physical version of the magnetic material is built or modified based on the simulation.

2. The system of claim 1, wherein the one or more data processors are further configured to determine the first reversible component using the specific vector play operator as follows:

$$h_{rek} = \begin{cases} h_{rek0} & \text{if } |h_k - h_{rek0}| < r_k(h_{rek}) \\ h_k - r_k(h_{rek}) \cdot \dfrac{h_k - h_{rek0}}{|h_k - h_{rek0}|} & \text{if } |h_k - h_{rek0}| \geq r_k(h_{rek}) \end{cases}$$

where $h_k$ represents the magnetic field, $h_{rek0}$ represents the initial reversible component, $h_{rek}$ represents the first reversible component, $h_s$ represents the saturation threshold, and $r_k$ represents a radius associated with the irreversible component.

3. The system of claim 2, wherein:

$$r_k(h_{rek}) = \begin{cases} \dfrac{1}{1-k_\mu}\sigma_k & \text{if } |h_{rek}| \leq (h_s - \sigma_k) \\ \dfrac{1}{1-k_\mu}(h_s - |h_{rek}|) & \text{if } (h_s - \sigma_k) < |h_{rek}| \leq h_s \\ 0 & \text{if } |h_{rek}| > h_s \end{cases};$$

where $\sigma_k$ represents an intrinsic coercivity for a k-th play hysteron, and $k_\mu$ represents a parameter associated with slopes of one or more recoil lines.

4. The system of claim 3, wherein the one or more hysteresis loops include a major hysteresis loop and one or more minor hysteresis loops, the minor hysteresis loops being formed based at least in part on the major hysteresis loop and the one or more recoil lines.

5. The system of claim 3, wherein the one or more data processors are further configured to determine a slope of a recoil line to be a linear function of a slope of a tangent line of a reversible curve at an intersection with the recoil line, the reversible curve being associated with the first reversible component.

6. The system of claim 3, wherein the slopes of the one or more recoil lines are the same if $k_\mu$ is equal to 0.

7. The system of claim 3, wherein the slopes of the one or more recoil lines are different.

8. The system of claim 2, wherein the one or more data processors are further configured to determine the first reversible component using an iteration algorithm based at least in part on the specific vector play operator.

9. The system of claim 8, wherein the iteration algorithm comprises:
1) assuming $h_{rek} = h_{rek0}$;
2) obtaining $h_{irk}$ from $r_k$ and a direction of $(h_k - h_{rek0})$;
3) calculating $\Delta h = h_k - (h_{rek} + h_{irk})$;
4) letting $h_{rek} = h_{rek} + \alpha \Delta h$; and
5) repeating operations 2)-4) until $|\Delta h|/h_s < \varepsilon$,
wherein $h_{irk}$ represents the irreversible component.

10. The system of claim 2, wherein the one or more data processors are further configured to determine the magnetic field based at least in part on the flux density using the specific vector play operator.

11. The system of claim 2, wherein the one or more data processors are further configured to determine an irreversible component based at least in part on the first reversible component.

12. The system of claim 11, wherein the one or more data processors are further configured to determine the irreversible component in the direction of $h_k - h_{rek0}$ with a length of $r_k$.

13. The system of claim 11, wherein the irreversible component is approximately equal to zero when the magnetic field exceeds a saturation threshold.

14. The system of claim 11, wherein:
the magnetic field corresponds to a rotating magnetic field; and
a magnetic hysteresis loss of the magnetic field is approximately equal to zero when the magnetic field exceeds the saturation threshold.

15. The system of claim 1, wherein a maximum value of the irreversible component is selected to equal an intrinsic coercivity value when the reversible component is substantially zero, and wherein the maximum value of the irreversible component is selected to decrease to zero as the reversible component approaches saturation.

16. A processor-implemented system for analyzing magnetic hysteresis of a magnetic material, the system comprising:
one or more data processors configured to:
determine a plurality of flux densities associated with a magnetic material based on physical characteristics of the magnetic material that is to be built or modified;
determine a plurality of first magnetic fields based at least in part on the flux densities;
determine a total magnetic field based on a weighted sum of the first magnetic fields, wherein the total magnetic field is determined according to a series distributed model that indicates fluctuations in the total magnetic field over time as a function of weighted (w) flux densities (b) according to:

$$h(t) = \sum_{k=1}^{n} w_k h_k(b);$$

generate one or more hysteresis loops based at least in part on the total magnetic field for analyzing magnetic hysteresis of the magnetic material;
a non-transitory computer-readable storage medium configured to store data related to the flux densities, data related to the first magnetic fields, and data related to the total magnetic field for performing a simulation of behavior of the magnetic material, wherein a physical version of the magnetic material is built or modified based on the simulation.

17. The system of claim 16, wherein the one or more data processors are further configured to determine the first magnetic fields using an iteration algorithm based on the flux densities.

18. The system of claim 16, wherein the one or more hysteresis loops include a major hysteresis loop and one or more minor hysteresis loops, the minor hysteresis loops being formed by the major hysteresis loop and one or more recoil lines.

19. The system of claim 18, wherein the recoil lines correspond to different slopes.

20. The system of claim 18, wherein the data processors are further configured to identify one or more parameters based at least in part on an input flux density curve and an input hysteresis loop.

21. The system of claim 20, wherein the one or more parameters include: a simulation flux density curve, information associated with slopes of the recoil lines, and a plurality of weighting factors associated with the first magnetic fields.

22. A processor-implemented method for analyzing magnetic hysteresis of a magnetic material, the method comprising:
determining, using one or more data processors, an initial reversible component of a magnetic field applied to a magnetic material based on physical characteristics of the magnetic material that is to be built or modified;
determining, using the one or more data processors, a first reversible component based at least in part on the initial reversible component using a vector play model by selecting a specific vector play operator that (1) limits a magnitude of an irreversible component of the magnetic field to a maximum value to ensure that a rotational loss property is maintained in saturation and (2) maintains a correct total field for the determined first reversible component;

determining, using the one or more data processors, a flux density; and generating, using the one or more data processors, one or more hysteresis loops based at least in part on the flux density for analyzing magnetic hysteresis of the magnetic material for performing a simulation of behavior of the magnetic material, wherein a physical version of the magnetic material is built or modified based on the simulation.

23. A processor-implemented method for analyzing magnetic hysteresis of a magnetic material, the method comprising:

determining, using one or more data processors, a plurality of flux densities associated with a magnetic material based on physical characteristics of the magnetic material that is to be built or modified;

determining, using the one or more data processors, a plurality of first magnetic fields based at least in part on the flux densities;

determining, using the one or more data processors, a total magnetic field based on a weighted sum of the first magnetic fields, wherein the total magnetic field is determined according to a series distributed model that indicates fluctuations in the total magnetic field over time as a function of weighted (w) flux densities (b) according to:

$$h(t) = \sum_{k=1}^{n} w_k h_k(b);$$

and generating, using the one or more data processors, one or more hysteresis loops based at least in part on the total magnetic field for analyzing magnetic hysteresis of the magnetic material for performing a simulation of behavior of the magnetic material, wherein a physical version of the magnetic material is built or modified based on the simulation.

24. A non-transitory computer readable storage medium comprising programming instructions for analyzing magnetic hysteresis of a magnetic material, the programming instructions being configured to cause one or more data processors to execute operations comprising:

determining an initial reversible component of a magnetic field applied to a magnetic material based on physical characteristics of the magnetic material that is to be built or modified;

determining a first reversible component based at least in part on the initial reversible component using a vector play model by selecting a specific vector play operator that (1) limits a magnitude of an irreversible component of the magnetic field to a maximum value to ensure that a rotational loss property is maintained in saturation and (2) maintains a correct total field for the determined first reversible component;

determining a flux density; and generating one or more hysteresis loops based at least in part on the flux density for analyzing magnetic hysteresis of the magnetic material for performing a simulation of behavior of the magnetic material, wherein a physical version of the magnetic material is built or modified based on the simulation.

25. A non-transitory computer readable storage medium comprising programming instructions for analyzing magnetic hysteresis of a magnetic material, the programming instructions being configured to cause one or more data processors to execute operations comprising:

determining a plurality of flux densities associated with a magnetic material based on physical characteristics of the magnetic material that is to be built or modified;

determining a plurality of first magnetic fields based at least in part on the flux densities;

determining a total magnetic field based on a weighted sum of the first magnetic fields, wherein the total magnetic field is determined according to a series distributed model that indicates fluctuations in the total magnetic field over time as a function of weighted (w) flux densities (b) according to:

$$h(t) = \sum_{k=1}^{n} w_k h_k(b);$$

generating one or more hysteresis loops based at least in part on the total magnetic field for analyzing magnetic hysteresis of the magnetic material for performing a simulation of behavior of the magnetic material, wherein a physical version of the magnetic material is built or modified based on the simulation.

\* \* \* \* \*